(12) United States Patent
Gurary et al.

(10) Patent No.: US 6,197,121 B1
(45) Date of Patent: Mar. 6, 2001

(54) CHEMICAL VAPOR DEPOSITION APPARATUS

(75) Inventors: Alexander I. Gurary, Bridgewater; Richard A. Stall, Belle Mead; Robert F. Karlicek, Jr., Flemington; Peter Zawadzki, Martinsville; Thomas Salagaj, South Plainfield, all of NJ (US)

(73) Assignee: Emcore Corporation, Somerset, NJ (US)

( * ) Notice: Subject to any disclaimer, the term of this patent is extended or adjusted under 35 U.S.C. 154(b) by 0 days.

(21) Appl. No.: 09/345,032

(22) Filed: Jun. 30, 1999

Related U.S. Application Data

(63) Continuation of application No. 08/757,909, filed on Nov. 27, 1996, now abandoned.

(51) Int. Cl.[7] .................................................. C23C 16/00
(52) U.S. Cl. ..................... 118/725; 118/715; 118/724; 118/730
(58) Field of Search ................................. 118/715, 719, 118/724, 725, 730

(56) References Cited

U.S. PATENT DOCUMENTS

| | | |
|---|---|---|
| 3,645,230 | 2/1972 | Huggle . |
| 4,446,817 | 5/1984 | Crawley . |
| 4,607,591 | 8/1986 | Stitz . |
| 4,771,730 | 9/1988 | Tezuka . |
| 4,794,220 | 12/1988 | Sekiya . |
| 4,997,677 | 3/1991 | Wang et al. . |
| 5,024,748 | 6/1991 | Fujimura . |
| 5,063,031 | 11/1991 | Sato . |
| 5,136,975 | 8/1992 | Bartholomew et al. . |
| 5,173,336 | 12/1992 | Kennedy . |
| 5,174,825 | 12/1992 | White . |
| 5,284,519 | 2/1994 | Gadgil . |
| 5,344,492 | 9/1994 | Sato et al. . |
| 5,370,739 | 12/1994 | Foster et al. . |
| 5,421,892 | 6/1995 | Miyagi . |
| 5,500,256 | 3/1996 | Watabe . |
| 5,595,606 | 1/1997 | Fujikawa et al. . |
| 5,653,806 | 8/1997 | Van Buskirk . |

FOREIGN PATENT DOCUMENTS

| | | |
|---|---|---|
| 0 687 749 A1 | 6/1995 | (EP) . |
| 61-101020 | 5/1986 | (JP) . |
| 1-177228 | 7/1989 | (JP) . |
| 1-294868 | 11/1989 | (JP) . |
| 8-291385 | 11/1996 | (JP) . |

OTHER PUBLICATIONS

G. Tompa et al., "Design and applications of large area RDRs," *III–Vs Review*, vol. 7, No. 3, 1994.

H. Hitchman and K. Jensen, "Chemical Vapor Deposition, Principles and applictions," *Academic Press*, 1993; pp. 59–65.

D. Fotiadis, A. Kremer, D. McKenna, K. Jensen, "Complex phenomena in vertical MOCVD reactors: effects on deposition uniformity and interface abruptness," *Journal of Crystal Growth* 85 (1987) 154–164.

Primary Examiner—Richard Bueker
(74) Attorney, Agent, or Firm—Lerner, David, Littenberg, Krumholz & Mentlik, LLP

(57) ABSTRACT

Reactors for growing epitaxial layers on substrates are disclosed including rotatable substrate carriers and injectors for injecting gases into the reactor towards the substrates on the carriers and including a gas separator for separately maintaining various gases between gas inlets and the injector. Various reactor embodiments are disclosed including removable gas separators, and particular injectors which include cooling channels, as well as flow restrictors mounted within the reactors to restrict the flow of the gases to the substrates from the injector, and heaters mounted within the rotatable shell holding the substrate carriers so that the heaters can be accessed and removed through a lid forming a wall of the reactor.

58 Claims, 3 Drawing Sheets

CHEMICAL VAPOR DEPOSITION APPARATUS

CROSS-REFERENCE TO RELATED APPLICATIONS

The present application is a continuation of U.S. application Ser. No. 08/757,909, filed on Nov. 27, 1996, now abandoned, the disclosure of which is incorporated by reference herein.

FIELD OF THE INVENTION

The present invention relates to chemical vapor deposition reactors, and more particularly metal organic chemical vapor phase deposition reactors. More particularly, the present invention relates to such reactors of the rotating disk reactor type. Still more particularly, the present invention relates to such rotating disk reactors in which one or more gases are injected onto the surface of a rotating substrate carrier holding a substrate for growing various epitaxial layers thereon.

BACKGROUND OF THE INVENTION

Molecular beam epitaxy (MBE) and chemical vapor depositions (CVD) and, more particularly, metal organic chemical vapor deposition (MOCVD) have become the two leading technologies for the deposition of epitaxial layers. These, in turn, are critical to the digital electronics and optical electronic compound semiconductor industry. The use of molecular beam epitaxy, however, while continuing to offer more precise control, is by its nature slow, expensive and difficult to maintain. Therefore, significant efforts have been made to improve MOCVD or organo metallic vapor phase epitaxy (OMVPE) into a more precisely controllable system.

The MOCVD reactors have taken various forms, including horizontal reactors in which the wafer is mounted at an angle to the impinging process gases; horizontal reactors with planetary rotation in which the gases pass across the wafers; barrel reactors; and recently, vertical high-speed rotating disk reactors in which the gas or gases are injected downwardly onto a substrate surface which is rotating within a reactor.

These types of CVD reactors have been found useful for wide varieties of epitaxial compounds, including various combinations of semiconductor single films and multilayered structures such as lasers and LED'S.

The considerable number of these vertical reactors in which the wafers are located on a rotating disk include such reactors as shown in Hitchman et al., "Chemical Vapor Deposition. Principles and Applications," Academic Press, 1993; and Tompa et al., "Design and Application of Large Area RDRs," *III-Vs Review*, vol. 7, no. 3, 1994. In these reactors, in order to attempt to force the gas mixture to flow uniformly from the top of the reactor towards the wafer carrier, various techniques have been employed. These have included the use of a fine wire mesh, such as that shown in Wang et al., U.S. Pat. No. 4,997,677. In this reactor, the fine stainless steel wire mesh 46', which can also be a sintered coarse frit disk, is intended to more uniformly distribute the gases in this manner. In this case, however, the gases mix in an antechamber before passing through the wire mesh, and reactant gases can react with each other therein before entering the reactor chamber itself. In order to overcome such difficulties, the antechambers have been divided into segments for each reactant gas, for example, as shown in Tompa et al., mentioned above, and in European Patent No. 687,749, in which separate parallel chambers in separate planes carry separate gases which are then fed through individual conduits into the reactor chamber. Pre-reaction nevertheless occurs in such systems after they pass through the wire mesh and/or during flow to the wafer carrier itself. Some of these designs are also quite complicated. In addition, in Bartholomew et al., U.S. Pat. No. 5,136,975, both in the prior art device shown in FIG. 2 and in the injector of the invention shown in FIG. 4, various devices are used in an attempt to prevent the gases from interacting until after they leave a port from a secondary plenum. Similarly, in Watabe, U.S. Pat. No. 5,500,256, spiral gas flow paths are shown in FIG. 1a and FIG. 2 thereof.

Another problem encountered with rotating disk reactors is non-uniformity and temperature distribution. More particularly, it has been found that in the injector plates or other systems used for injection of the gases the center of the injector generally has a higher temperature than the edges connected to the reactor walls, thus resulting in premature decomposition of the wire mesh when it is used, as well as various flow disturbances. In European Patent No. 687,749, mentioned above, a separate coolant chamber 20 is utilized in connection with the various small tubes or conduits through which the gases are flowing. Uniform injector plate cooling cannot be obtained in this type of a device, which does not include provisions for forcing the water to flow around each of the tubes, for example. Also, in Bartholomew et al., discussed above, a cooling plate 72 is employed surrounding chute 96 from which the gases are injected into the reactor.

Another factor in connection with these rotating disk reactors relates to the relationship between the size of the reactor and the size of the rotating wafer carrier or substrate carrier plate. Thus, it is normally natural for the reactor to be larger in order to pump reactant therethrough. However, this, in turn, requires additional consumption of reactants, resulting in lower efficiency. On the other hand, in those reactors in which the inlet surface is smaller than that of the wafer carrier with a gradually increasing diameter, depletion effects cannot be eliminated. These include, for example, Sato et al., U.S. Pat. No. 5,344,492, as well as Fotiadis et al., "Complex Phenomena in Vertical MOCVD Reactors: Effects on Deposition Uniformity and Interface Abruptness," *General Crystal Growth* 85 (1987), pp. 154–164. Also, in Kennedy, U.S. Pat. No. 5,173,336, flows guides 52 are shown in FIG. 3 thereof for preventing portions of the chemical vapor flow from being deflected back towards the vapor source to suppress recirculation therein. In Fujaimura, U.S. Pat. No. 5,024,748, prior art references are discussed, such as that shown in FIG. 2, which use reflectors 13 for directing plasma onto a substrate in a microwave plasma processing apparatus.

There are also a number of different techniques which are employed for heating the wafer carriers in these reactors. Radiant heating elements are installed below the wafer carrier, such as those shown in the Hitchman et al. and Tompa et al. articles discussed above. In these types of devices, the heating assembly, however, is open to the reactor environment. This can cause various effects including reducing the life, time and repeatability of these processes. For this reason, in reactors such as those shown in the Fotiadis et al. article and in European Patent No. 687,749 discussed above, a heating assembly has been installed inside a rotating shell so that inert gases purged through the shell can provide a protective environment. In these reactors, the rotating shell is usually sealed by connection with a hollow shaft rotary vacuum feed-through having a diameter which is less than that of the heating elements, which cannot, therefore, be removed through the hollow shaft feed-through. Thus, the heating systems in these reactors are generally provided in a system in which they cannot be replaced or serviced without opening the reactor to the atmosphere. Also, in Stitz, U.S. Pat. No. 4,607,591, a lamp enclosure for heating lamps is included in a plasma-enhanced CVD reactor.

Finally, in these types of reactors, various systems are provided for rotating and sealing these reactor drive mechanisms. Most commonly, ferro-fluidic types of vacuum rotary feed-throughs are used to seal the rotating shafts, and these generally have a low temperature limit of below 100° C. Thus, complex and expensive cooling systems are required therefor. Some cooling systems are shown in Miagi, U.S. Pat. No. 5,421,892, and Tsuga, U.S. Pat. No. 4,771,730.

It is therefore an object of the present invention to provide a simple injector plate design for rotating disk reactors which can be scaleable to large diameters and which can introduce the various gases and/or reactants and maintain them separately within the reactor up to or close to the mixed gas thin boundary layer just above the wafer carrier itself.

It is yet another object of the present invention to design an injector plate which can also have a controllable uniform temperature profile.

It is yet another object of the present invention to develop a confined inlet reactor whose diameter is equal or close to that of the wafer carrier itself.

It is yet another object of the present invention to provide an inlet reactor design in which the diameter extension near the wafer carrier is designed to provide for higher deposition efficiency without depletion effects.

It is yet another object of the present invention to design a rotating disk reactor using a rotating shell in which the heating assembly is located within the shell and is purged by gases or pumped to a vacuum.

It is yet another object of the present invention to provide such a rotating disk reactor using a rotating shell which has a diameter equal to or larger than that of the heating assembly so that the heating assembly can be removed and different heating assemblies can be substituted therefor without altering the reactor design or opening the reactor to the atmosphere.

It is yet another object of the present invention to design a rotating disk reactor employing a rotating shell design with a simple and efficient cooling system for the rotating shaft.

SUMMARY OF THE INVENTION

In accordance with the present invention, these and other objects have now been realized by the invention of a reactor for growing epitaxial layers on a substrate comprising a reactor chamber, a substrate carrier rotatably mounted within the reactor chamber, whereby at least one of the substrates can be mounted on the substrate carrier, a first gas inlet, a second gas inlet, an injector for injecting the first and second gases into the reactor chamber towards the substrate carrier, and a gas separator for separately maintaining the first and second gases in a single plane parallel to the substrate carrier between the gas inlets and the injector and until the gases approach the substrate carrier. In a preferred embodiment, the gas separator includes first and second gas chambers in the plane parallel to the substrate carrier.

In accordance with a preferred embodiment of the reactor of the present invention, the reactor includes a carrier gas inlet, and the gas separator includes a third gas chamber between the first and second gas chambers for separately maintaining the carrier gas between the gas inlets and the injector, the injector thereby injecting the carrier gas into the chamber towards the substrate carrier between the first and second gases in order to maintain the first and second gases separate from each other.

In accordance with another embodiment of the reactor of the present invention, the gas separator includes first and second gas receiving portions for receiving the first and second gases from the first and second gas inlets, first and second gas chambers for distributing a quantity of the first and second gases prior to entry of the first and second gases into the injector, and wall means separating the first and second gas receiving portions from the first and second gas chambers, the wall means including aperture means for permitting the first and second gases to pass from the first and second gas receiving portions to the first and second gas chambers. In a preferred embodiment, the first and second gas chambers have a configuration defined by an arc of a circle.

In accordance with another embodiment of the reactor of the present invention, the reactor includes a mesh screen disposed between the gas separator and the injector for further distributing the first and second gases. In another embodiment, the injector includes a plurality of passages for the first and second gases. In another embodiment, the injector includes a plurality of passages for the first and second gases. Preferably, the injector includes cooling means for cooling the first and second gases passing through the plurality of passages.

In accordance with another embodiment of the reactor of the present invention, the reactor comprises a reactor chamber, a substrate carrier rotatably mounted within the reactor chamber, whereby at least one of the substrates can be mounted on the substrate carrier, a gas inlet, an injector for injecting gas into the reactor chamber towards the substrate carrier, and a removable gas separator removably disposed between the gas inlet and the injector for maintaining the gas in a predetermined portion of the gas separator, whereby the gas separator can be replaced with a different gas separator.

In accordance with one embodiment of the reactor of the present invention, the gas separator includes a gas receiving portion for receiving the gas from the gas inlet, a gas chamber for distributing a quantity of the gas prior to entry of the gas into the injector, and wall means separating the gas receiving portion from the gas chamber, the wall means including an aperture for permitting the gas to pass from the gas receiving portion to the gas chamber. In a preferred embodiment, a mesh screen is disposed between the gas separator and the injector for further distributing the gas.

In accordance with another embodiment of the reactor of the present invention, the gas inlet comprises a first gas inlet, and the apparatus includes a second gas inlet, whereby the injector injects the first and second gases into the reactor towards the substrate carrier, and the removable gas separator maintains the first and second gases separate from each other. In a preferred embodiment, the gas separator includes first and second gas chambers.

In accordance with another embodiment of the reactor of the present invention, the reactor comprises a reactor chamber, a substrate carrier rotatably mounted within the reactor chamber, whereby at least one of the substrates can be mounted on the substrate carrier, a first gas inlet, a second gas inlet, a carrier gas inlet, an injector for injecting the first and second gases and the carrier gas into the reactor chamber towards the substrate carrier, and a gas separator for separately maintaining the first and second gases and the carrier gas between the gas inlet and the injector and after the first and second gases and the carrier gas have exited from the injector towards the substrate carrier with the carrier gas disposed between the first and second gases. Preferably, the gas separator maintains the first and second gases and the carrier gas in a single plane parallel to the substrate carrier.

In accordance with one embodiment of the reactor of the present invention, the gas separator includes a first gas chamber for the first gas, a second gas chamber for the second gas, and a carrier gas chamber for the carrier gas.

In accordance with another embodiment of the this reactor of the present invention, the gas separator includes first and second gas receiving portions for receiving the first and second gases from the first and second gas inlets, first and second gas chambers for distributing a quantity of the first and second gases prior to entry into the injector, and wall means separating the first and second gas receiving portions from the first and second gas chambers, the wall means including aperture means for permitting the first and second gases to pass from the first and second gas receiving portions to the first and second gas chambers. In a preferred embodiment, the first and second gas chambers have a configuration defining an arc of a circle.

In accordance with another embodiment of the reactor of the present invention, the reactor includes a mesh screen disposed between the gas separator and the injector for further distributing the first and second gases.

In accordance with another embodiment of the reactor of the present invention, the injector includes a plurality of passages for the first and second gases. Preferably, the injector includes cooling means for cooling the first and second gases passing through the plurality of passages. In accordance with yet another embodiment of the reactor of the present invention, the reactor comprises a reactor chamber, a substrate carrier rotatably mounted within the reactor chamber, whereby at least one of the substrates can be mounted on the substrate carrier, a gas inlet, and an injector for injecting the gas into the reactor chamber towards the substrate carrier, the injector including a plurality of coolant passages extending across the injector and a plurality of gas apertures alternating with the plurality of coolant passages, whereby the gas is cooled by at least two of the coolant passages as it passes through at least one of the plurality of gas apertures into the reactor chamber.

In accordance with another embodiment of the reactor of the present invention, the plurality of coolant passages comprises a plurality of tubular conduits arranged in a parallel array. Preferably, the plurality of gas apertures comprises a plurality of elongated slots arranged in a parallel array.

In another embodiment, the reactor includes connecting passages for connecting at least two of the plurality of tubular conduits whereby the coolant can flow continuously therethrough.

In accordance with another embodiment of the reactor of the present invention, the plurality of coolant passages comprises a plurality of coolant passage segments, and the reactor includes a plurality of coolant inlets and a plurality of coolant outlets, whereby the coolant can be separately fed to and withdrawn from each of the plurality of coolant segments. Preferably, four such coolant segments are included.

In accordance with another embodiment of the reactor of the present invention, the injector includes an inner surface facing the substrate carrier, and the plurality of elongated slots includes a chamfered surface on the inner surface of the injector thereby increasing the cooling effect of the plurality of tubular conduits.

In accordance with another embodiment of the apparatus of the present invention, the reactant gas inlet comprises a first gas inlet and the reactor includes a second gas inlet, and a gas separator for separately maintaining the first and second gases between the gas inlets and the injector, the gas separator including first and second gas chambers for distributing a quantity of the first and second gases prior to entry into the injector.

In a preferred embodiment, the apparatus includes a carrier gas inlet, and the gas separator includes a third gas chamber between the first and second gas chambers for separately maintaining the carrier gas between the gas inlets and the injector, the injector thereby injecting the carrier gas into the chamber towards the substrate carrier between the first and second gases in order to separate the first and second gases from each other.

In accordance with another embodiment of the reactor of the present invention, the gas separator includes first and second gas receiving portions for receiving the first and second gases from the first and second gas inlets, and wall means separating the first and second gas receiving portions from the first and second gas chambers, the wall means including aperture means for permitting the first and second gases to pass from the first and second gas receiving portions to the first and second gas chambers.

In accordance with another embodiment of the reactor of the present invention, the reactor comprises a reactor chamber, a substrate carrier rotatably mounted within the reactor chamber, the substrate carrier having a predetermined diameter, whereby at least one of the substrates can be mounted on the substrate carrier, a gas inlet, an injector for injecting the gas into the reactor chamber towards the substrate carrier, and a flow restricter mounted within the reactor chamber between the injector and the substrate carrier for restricting the flow of the gas therebetween, the flow restricter having a first end corresponding to the injector and a second end adjacent to the substrate carrier and defining an inner diameter at the first end substantially corresponding to the predetermined diameter of the substrate carrier and an inner diameter at the second end greater than the predetermined diameter of the substrate carrier. Preferably, the flow restricter includes cooling means. In a preferred embodiment, the cooling means comprises a passageway within the flow restricter for flowing a coolant therethrough.

In accordance with one embodiment of this reactor, the inner diameter of the flow restricter at the first end thereof includes substantially the entire length of the flow restricter. Preferably, the inner diameter of the flow restricter at the second end comprises a tapered surface having an increasing diameter in a direction approaching the substrate carrier.

In accordance with one embodiment of this reactor, the flow restricter is integral with the walls of the reactor chamber.

In accordance with another embodiment of the present invention, the reactor comprises a reactor chamber, a substrate carrier rotatably mounted within the reactor chamber, whereby at least one of the substrates can be mounted on the substrate carrier, a gas inlet, an injector for injecting the gas into the reactor chamber towards the substrate carrier, a flow restricter mounted within the reactor chamber between the injector and the substrate carrier for restricting the flow of the reactant gas therebetween, the flow restricter including cooling means. Preferably, the cooling means comprises a passageway within the flow restricter for flowing a coolant therethrough. In another embodiment, the flow restricter is incorporated into the walls of the reactor chamber.

In accordance with another embodiment of the reactor of the present invention, the reactor comprises a reactor chamber, a substrate carrier rotatably mounted within the reactor chamber, whereby at least one of the substrates can be mounted on the substrate carrier, a gas inlet, an injector for injecting the gas into the reactor chamber towards the substrate carrier, the substrate carrier comprising a substantially enclosed rotatable shell defining an inner space, and heating means for heating the substrate carrier, the heating means being disposed within the rotatable shell, the reactor chamber including access means for gaining access to the inner space defined by the rotatable shell whereby the heating means can be accessed and removed through the access means. In a preferred embodiment, the access means comprises a wall of the reactor chamber.

In accordance with one embodiment of this reactor, the reactor includes first pressure means for maintaining a first pressure inside the reactor chamber, and second pressure means for maintaining a second pressure inside the rotatable shell, the first pressure being greater than the second pressure.

In accordance with one embodiment of this reactor, the heating means comprises a radiant heater. In another embodiment, the rotatable shell includes an upper end wall facing the injector and the reactor includes a removable substrate support mounted on the upper end wall for rotation therewith. In accordance with another embodiment of this reactor of the present invention, the rotatable shell includes an upper end facing the injector, and including a removable substrate support mounted on the upper end of the rotatable shell for rotation therewith so as to provide an upper end wall for the rotatable shell and thereby creating the substantially enclosed inner space.

In accordance with another embodiment of this reactor of the present invention, the rotatable shell comprises a material selected from the group consisting of graphite, boron nitride, silicon carbon, molybdenum, and high-temperature superalloys.

In accordance with another embodiment of the reactor of the present invention, the reactor comprises a reactor chamber, a substrate carrier rotatably mounted within the reactor chamber whereby at least one of the substrates can be mounted on the substrate carrier, a gas inlet, an injector for injecting the gas into the reactor chamber towards the substrate carrier, the substrate carrier comprising a rotatable shell defining an inner space and including an inner surface and an outer surface, rotation means for rotating the rotatable shell within the reactor chamber, and cooling means for cooling the reactor chamber, the cooling means including an inner cooling member for cooling the inner surface of the rotatable shell and an outer cooling member for cooling the outer surface of the rotatable shell. In accordance with a preferred embodiment, the rotation means comprises a spindle mounted with respect to the rotatable shell, a drive pulley, and a drive belt connecting the drive pulley to the spindle for rotating the rotatable shell. Preferably, the spindle includes bearings for rotatably supporting the rotatable shell, whereby the cooling means cools the bearings. In another embodiment, the drive pulley comprises a drive belt comprising rubber, preferably neoprene rubber.

BRIEF DESCRIPTION OF THE DRAWINGS

The present invention can be more fully appreciated with reference to the following detailed description, which, in turn, refers to the Figures, in which.

DETAILED DESCRIPTION

Figure 1:
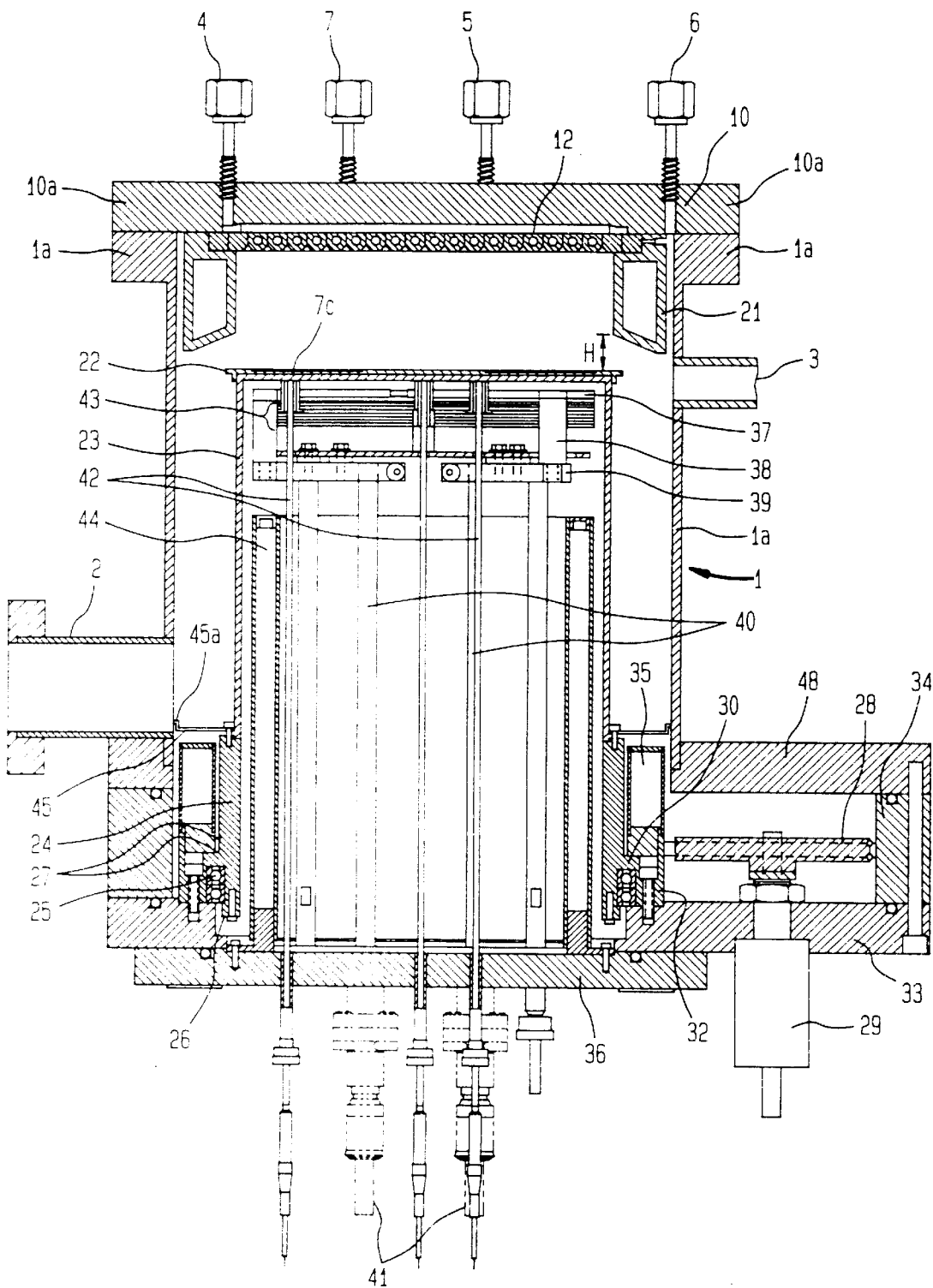
FIG. 1 is a side, elevational, sectional view of a reactor in accordance with the present invention.

Referring to the Figures, in which like numerals refer to like elements thereof, FIG. 1 is a cross-sectional view of a reactor in accordance with the present invention. The reactor itself generally comprises a generally vertical tube 1 having cylindrical walls 1a, preferably formed of vacuum grade stainless steel. The reactor itself includes an exhaust conduit 2 extending from a wall 1a of the reactor 1, and which can then be connected to a pumping system. Reactor 1 also includes a flange opening 3 which can be connected with a load lock apparatus so that wafers can be transported inside the reactor without opening the reactor to the atmosphere. A viewing port with a shutter (not shown) can also be provided in order to permit visual observation of the wafer carrier 22 or substrate carrier (or thermal absorber) rotatably mounted within the reactor 1. Although not specifically shown in the drawings, it is also possible for the reactor itself to include a water cooling jacket for use during deposition processes at extremely high temperatures, as well as an inner liner to simplify cleaning and maintenance procedures for the reactor.

Within the reactor 1 wafers which are to be treated with various reactant gases or vapors are mounted on a rotating substrate carrier or susceptor 22 so that the gases can impinge directly onto the surface thereof. The general principles involved in connection with the application of various gases to these wafers is well known. Indeed, the principles of chemical vapor deposition (CVD) are well known and are essential processes in the fabrication of integrated circuits. The deposited layers in such processes fulfill a number of functions and can range from metals and metal alloys to semiconductors and insulators. In these processes, the decomposition of a gaseous precursor, either homogeneously or heterogeneously, produces a solid thin film, and a wide range of conditions can be employed with respect to temperature, pressure, flow rates and the like. Silicon processing is a relatively well understood technique, but compound semiconductors have emerged as significant rivals for certain applications. The characteristics of Group III–V semiconductors, such as gallium arsenide, have been known for quite some time. Thus, with the advent of metal organic chemical deposition (MOCVD), this technique has grown in significance. Thus, while the applications of the reactors of the present invention are considerable, the overall structure of the reactors of the present invention can be applied to these various techniques in order to create significant improvements in the uniformity of the epitaxial or film layers applied to the wafers themselves and to the overall efficiency of the process carried out thereby.

The types of material systems to which the rotating disk reactors of the present invention can be applied are thus extremely varied. They include the Group III–V products mentioned above. These include such Group III–V compound semiconductors as GaAs, GaP, $GaAs_{1-x}P_x$, $Ga_{1-y}Al_yAs$, $Ga_{1-y}In_yAs$, AlAs, InAs, InP, InGaP, InSb, GaN, InGaN, and the like. However, these reactors can also be applied to other systems. These include Group II–VI compounds, such as ZnSe, CdTe, HgCdTe, CdZnTe, CdSeTe, and the like; Group IV—IV compounds, such as SiC, diamond, and SiGe; as well as oxides, such as YBCO, $BaTiO_2$, $MgO_2$, $ZrO$, $SiO_2$, ZnO and ZnSiO; and metals, such as Al, Cu and W. Furthermore, the resultant materials will have a wide range of electronic and opto-electronic applications, including high brightness light emitting diodes (LED's), lasers, solar cells, photocathodes, HEMT's and MESFET's.

In order to grow epitaxial layers on the wafers contained within the reactor itself, reactant gases must be introduced into the reactor. The term reactant "gases" is meant to include gases and vapors existing at conditions prevailing within the reactor, including elevated temperatures and reduced pressures as used therein. Mixtures of such gases can also be utilized in some cases; i.e., generally where the gases are chemically compatible. Also, a particular reactant gas can be diluted with another inert gas where desired. In any event, in this case the reactant gases are introduced into the reactor 1 through connectors 4, 5, 6 and 7, as shown in FIG. 1. Different gases, including reactant gases and/or inert or carrier gases can be supplied to the reactor through each of the various connectors 4, 5, 6 and 7, if desired. Between these connectors and the wafers 70 on substrate carrier 22, it is necessary to provide a highly uniform dispersion of the gases over the entire surface of the wafer, and, at the same time, to prevent premature reaction between the reactant gases as much as possible; i.e., as close to the boundary layer above the wafers as possible. The gases themselves are thus released into the reactor 1 downwardly in a direction perpendicular to the surface of the substrate carrier 22, from injector plate 12. Between the connectors and injector plate 12, however, it is necessary to maintain the gases separate from each other, and to then inject them into the chamber in a way which not only provides for the uniformity discussed above, but which again prevents premature interaction between the reactant gases.

Figure 2:
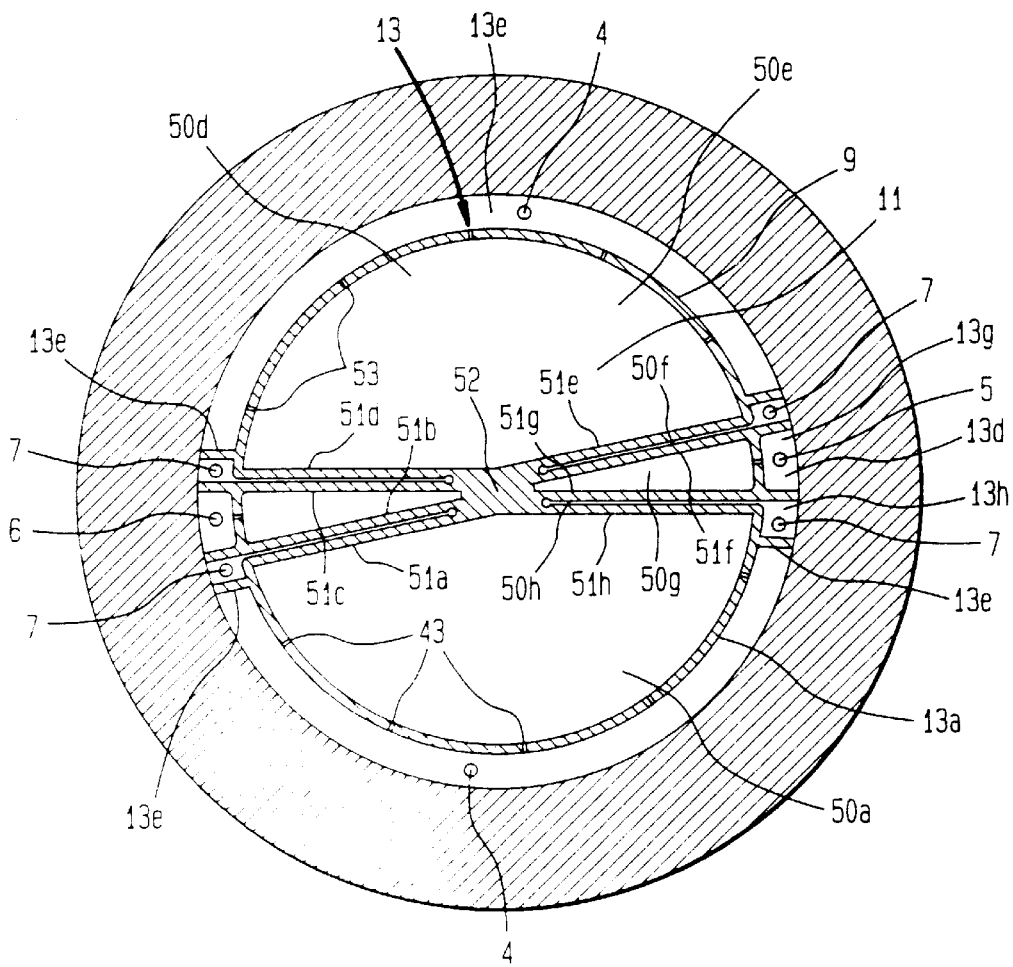
FIG. 2 is a top, elevational view of the separator used in the reactor shown in FIG. 1.
Figure 3:
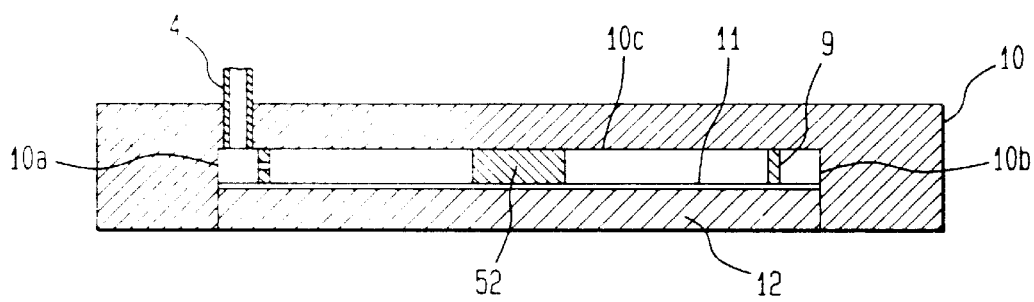
FIG. 3 is a side, sectional view of the separator and injector shown in FIG. 2.

The latter is accomplished by means of separator 9 best shown in FIGS. 2 and 3. Thus, the reactor itself is formed as an elongated tubular member having a cylindrical wall 1a, and a top plate 10, connected to the tubular wall 1a by means of corresponding flange portions 10a and 1b, and the reactor is closed at the lower end by annular base plate 33, which extends outwardly beyond the periphery of the cylindrical side wall 1a of the reactor 1, as shown in FIG. 1, for reasons which are discussed further below. In any event, annular base plate 33 includes an offset opening which is covered by circular lid 36.

The separator 9 is preferably a separate, unitary member which is clamped between top plate 10 and the injector plate 12, with a wire mesh screen 11 sandwiched therebetween, as specifically shown in FIG. 3. The separator 9 includes an annular separator wall 13 divided into a number of separate wall portions 13a–13d in the embodiment shown in FIG. 2. Furthermore, these wall portions 13a–d include outwardly projecting flanges 13e which extend between the wall portions 13a–13d to outer wall 10b of the top plate 10. This serves to divide the annular area between the outer wall 10b of the end wall 10, the annular separator wall 13, the upper wall 10c of the end wall 10, and the wire mesh 11, into separate semi-annular compartments 13e–13l.

Internally of the annular separator wall 13, there are provided a number of gas chambers 50a–50h. These chambers are thus defined by the inner surface of the semi-annular wall portions 13a–13d, and a number of outwardly extending radial wall portions 51a–51h, all extending from a central hub 52. Again, each of these chambers 50a–50h is defined at the top by the inner wall 10c of the top member 10 and at the bottom by the wire mesh 11. Each of the gases enters one of the semi-annular gas compartments 13e13l through an aperture at the end of connectors 4, 5, 6 and 7. In the embodiment shown in FIG. 2, for example, there are two connectors 4, a single connector 5, a single connector 6, and four connectors 7. The gas distributed in semi-annular compartments 13e and 13i from connector 4 can then enter inner chambers 50a and 50e through a number of apertures 53 in semi-annular wall portions 13a and 13c. Thus, the particular gas flowing in connectors 4 is evenly distributed in inner chambers 50a and 50e for subsequent entry into the reactor 1 through the wire mesh as discussed below in a direction perpendicular to the plane of the separator 9 in FIG. 2. In a similar manner, the particular gas in connector 5 will enter semi-annular compartment 13g, and then pass through an aperture 53 in the semi-annular wall portion 13d to enter inner gas chamber 50g. The gas supplied through connector 6 similarly enters outer gas compartment 13k, passes through aperture 52 in inner wall portion 13b, and passes into inner gas chamber 50c.

Gas entering through connectors 7, such as an inert or carrier gas, enters outer chambers 13f, 13h, 13j, and 13l, in a similar manner. In this case, the gas passes directly into inner chambers 50f, 50h, 50b and 50d, respectively. These chambers are narrow slots between radial wall portions 51e and 51f, 51g and 51h, 51a and 51b, and 51c and 51d, respectively.

In a preferred embodiment of the present invention, as noted above, the entire separator 9 is a single piece, and is retained in place solely by being clamped between the top slot 10 and the injector plate 12. In this manner, by removing the top plate 10, it is a relatively easy task to remove the separator 9, and replace it with a new separator 9 which can have an entirely different configuration; i.e., with a different, selected number of gas chambers for a particular application. This permits a single reactor to be applicable to a number of different processes for growing epitaxial layers on various substrates, again by simply replacing the separator 9, and possibly altering the gas feed through a variety of gas inlets associated therewith.

The lower surface of the various gas chambers is defined by wire mesh 11. The wire mesh itself can be made from a variety of materials, depending upon the conditions required by the ultimate intended use thereof. Thus, in general, for many applications stainless steel 316 can be utilized. For somewhat higher temperature applications, however, it may be necessary or desirable to use INCONEL 600 or HASTELLOY. For extremely high-temperature applications, however, it may become necessary to utilize tungsten or molybdenum. The usual wire mesh size is 165×1400, for a 0.06" thick screen. On the other hand, a wire mesh size of 50×700 can be used for a 0.01" thick screen. Wire mesh screens of this type are thus readily available, such as from Unique Wire Weaving Co. Inc. of New Jersey.

These mesh screens can thus generate a pressure drop in the range of from about 0.1 to 1.0 Torr over a 10.0" diameter injector plate under typical deposition conditions. Such a pressure drop is generally sufficient to provide a uniform distribution of the initial reactants thereon.

In a specific example of use of the apparatus of the present invention for growing gallium nitride on a wafer, the two connectors 4 are used to supply ammonia to the semi-annular outer compartments 13e and 13i, and thus to the two corresponding inner chambers 50a and 50e. Connector 5 is used for supplying trimethyl gallium to the annular outer gas compartment 13g and thus into the inner gas chamber 50g; connector 6 is used to supply reactants for doping, such as $Si_2H_2$, $(C_2H_5)_2Mg$, and $(C_2H_5)Te$, to the annular gas compartment 13k and then into the corresponding inner gas chamber 50c; and connectors 7 are used to supply carrier gas, such as hydrogen, nitrogen and argon (all in an ultrapure form) into the four annular compartments 13j, 13l, 13f and 13h, and thus into the slots or inner gas chambers corresponding thereto; namely, inner chambers 50b, 50d, 50f and 50h. Thus, the carrier gas can be an inert gas.

As can thus be seen, the gases initially flow perpendicularly to the plane of the separator 9 as shown in FIG. 2, through the various connectors. Within the plane of the separator, the gases are then forced to flow parallel to the surface of the wire mesh 11 in the various chambers discussed above. Subsequently, however, these gases will then reverse flow, and flow perpendicular to the plane of FIG. 2 through the wire mesh 11, and will ultimately be supplied to the reactor 1. Intermediate gas flow in a direction parallel to the plane of FIG. 2 into the various chambers is thus another element in providing for uniform distribution of the gases throughout each of these chambers. Furthermore, placement of the carrier gas in the manner shown through the four connectors 7 shown in FIG. 2 and distribution in the inner gas chambers 50b, 50d, 50f and 50h, permits the carrier gas to flow into the reactor perpendicular to the plane of FIG. 2 in a manner which separates the various reactant gases from each other even after the gases have exited the gas injector 12 and passed into the reactor itself. Fine tuning of the precise location above the substrate carrier 22 at which the various gases can react with each other can also be achieved by regulating the gas flow rates for the individual gases entering the reactor through connectors 4, 5, 6 and 7.

Referring again to wire mesh 11, the wire mesh also serves to generate a pressure difference of between about 0.1 and 0.5 Torr between the reactor and the various chambers 50a–50h thereabove. This, again, allows for more uniform reactant distribution in the plane of the separator 9.

Below the wire mesh 11 is located the injector plate 12 as shown in FIGS. 3–6. This injector plate not only serves to provide mechanical contact between the wire mesh 11 and the separator 9, but since it is water-cooled, it also helps provide for a uniform temperature and cooling of the wire mesh.

Figure 5:
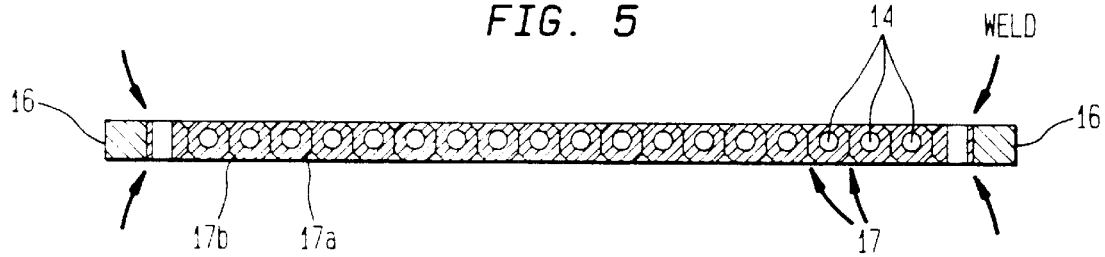
FIG. 5 is a side, sectional view of the injector shown in FIG. 4.

Referring to FIG. 5, it can be seen that the injector plate itself comprises a number of parallel conduits 14 which act as coolant channels extending across the surface thereof. The interior openings of these conduits 14 are thus utilized to flow a coolant such as water therethrough. The specific distance between each of these coolant channels 14 can be designed to satisfy specific cooling requirements in any particular case. The distance between these coolant channels 14, however, is generally between one and two plate thicknesses so as to provide for uniform temperature distribution thereby. The use of such coolant channels 14, in which a coolant, such as water, is forced through a plurality of these channels 14, ensures that there are no points of flow stagnation. This, in turn, further ensures uniform temperature maintenance throughout the surface of the injector itself. This readily reproducible constrained flow system thereby ensures the avoidance of hot spots and areas of non-uniform cooling. Temperature stability throughout the entire run is also ensured.

Figure 4:
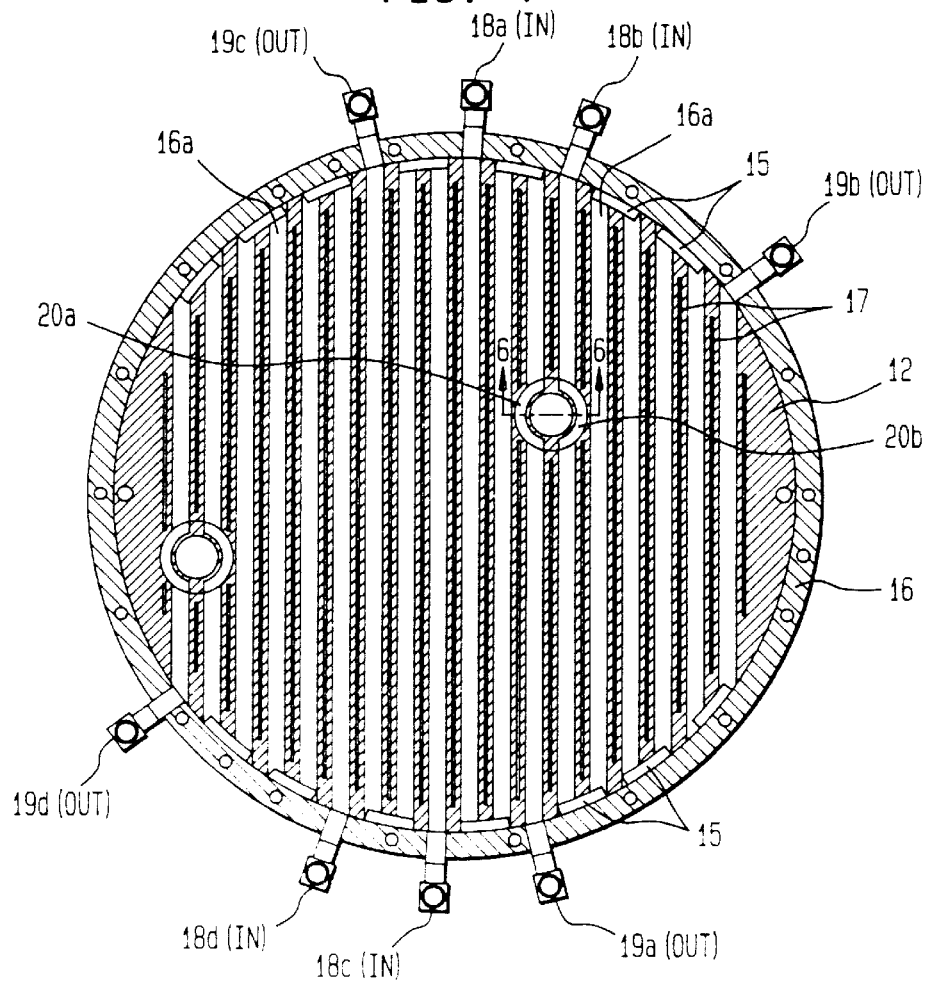
FIG. 4 is a top, elevational, sectional view of the injector used in the reactor shown in FIG. 1.

As can be seen from FIG. 4, at the end of alternate pairs of these coolant channels 14, connecting channels 15 are provided. The outer surface of these connecting channels 15 is defined by the inner surface 16a of outer annular wall 16, which is preferably welded to the injector plate 12 to seal all of the water channels therewithin. The various coolant channels 14 can be divided into coolant channel sectors depending on the number of channels connected together by means of connector channels 15. Thus, in the embodiment shown in FIG. 4, for example, there are four such coolant channel sectors. Each sector includes a water inlet and a water outlet. Thus, water inlets 18a, 18b, 18c and 18d are provided. The water from inlets 18a and 18b will thus pass through three of the coolant channels 14 and two of the connector channels 15 before passing through water outlets 19a and 19c, respectively. Similarly, the water from inlets 18b and 18d will pass through six parallel coolant channels 14 and five connecting channels 15 before exiting through water outlets 19b and 19d, respectively. It is noted, however, that the number of coolant sectors can be varied depending upon the specific cooling requirements for any particular application. Indeed, the particular number of coolant channels which are required can be readily estimated. In a particular example, with a reactor having a 7" wafer carrier for gallium nitride deposition on seven 2.0" wafers, the energy radiated by the wafer carrier can be calculated as $W1 = k \times e \times F \times T^4$, wherein k=5.67E-8 W/m2K4 (Stefan-Boltzman constant); where e=0.85 (emissivity for SiC coated wafer carrier 22); F=0.248 m$^2$ (wafer carrier 22 surface); and T=1325 K (typical process temperature for gallium nitride deposition). The energy which must therefore be dissipated by the cooling water is approximately 20% of the energy radiated by the wafer carrier 22. (The view factor between wafer carrier 22 and top plate 10 is about 0.2). Thus, since $W2=0.2 \times W1$, from another side this power can be calculated as: $W2 = 62.7 \times c \times N \times V \times grad\ T$, where c=4.2 kJ/kg C (specific heat for water); N=number of water cooling channels; V=1.5 gal/min (water flow through 0.25" diameter channel under pressure of 30 psi); and grad T=required injector plate temperature uniformity.

From these equations, it can thus be concluded that $N = 0.0032 \times k \times e \times F \times T^4 / 0.275 \times c \times V \times grad\ T$.

The number of cooling channels to thus provide the required injector temperature uniformity according to the final equation above is thus shown in Table 1 as follows:

TABLE 1

| INJECTOR PLATE TEMPERATURE UNIFORMITY, +/- C | NUMBER OF WATER COOLED CHANNELS |
| --- | --- |
| 2.5 | 4 |
| 5 | 2 |
| 10 | 1 |

The gases contained in the various inner gas chambers 50a–50h, after passing through wire mesh 11, pass through the injector plate 12 between the coolant channels 14 through slits 17 which can be best seen in FIG. 5. Each of these lengthwise-extending slits 17 is preferably between about 0.03" and 0.06" in width, and is preferably produced within the injector plate 12 by the application of electro-discharge technology. Furthermore, on the inner surface of the injector plate 12, again as best shown in FIG. 5, chamfered surfaces 17a and 17b are provided so as to effectively widen the area of the slits 17 at that surface. These chamfered surfaces thus provide for even more uniform cooling by removing injector plate material from the areas further from the coolant channels 14, as well as providing better flow distribution near the injector plate surface by eliminating "dead space" between each of the two slits 17 adjacent to each other. Instead of lengthwise-extending slit 17, a plurality of axisymmetrical holes or apertures can also be used.

Figure 6:
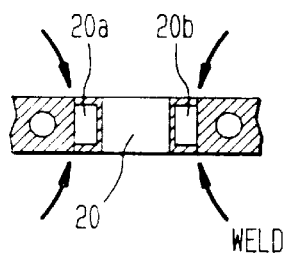
FIG. 6 is a side, elevational, sectional view of the portion of the injector shown in FIG. 4 taken along lines a—a thereof.

Referring to FIG. 6, spoons 20 can be welded into the injector plate 12 for providing direct optical viewing of the wafers for pyrometric wafer temperature measurements and other in situ process control equipment. Thus, as can be seen in FIGS. 4 and 6, the adjacent coolant channels 14 are not interrupted by being connected to arcuate channels portions 20a and 20b surrounding the spoon 20. Thus, with smaller injector plates, drilled holes can provide for these portions of the coolant channel, whereas for larger injector plates, such as with diameters of 12" or more, welded tubing can be employed for this purpose.

Turning again to FIG. 1, it can be seen that the various gases are now injected in a direction perpendicular to the surface of the wafer carrier 22 from the injector plate 12 downwardly, and separated from each other in the manner discussed above. Extending downwardly from the perimeter of top plate 10 surrounding the injector plate 12 is an annular flow restricter 21. The purpose of flow restricter 21 is to confine the downwardly flowing stream of reactant and carrier gases to a circular area substantially corresponding to the circular area of the top of the substrate carrier 22. Thus, the inner diameter of the flow restricter 21 at its upper end, namely adjacent to gas injector 12, will be substantially equal to the diameter of the wafer carrier 22. This diameter of the flow restricter 21 remains essentially the same until the inner wall of the flow restricter 21 reaches a distance H from the surface of the substrate carrier 22. At this point, the inner diameter of the flow restricter 21 increases in the manner shown. The distance H is a distance determined to approximate the thickness of the boundary layer of the reactants which is generated from the flow of the reactant gases and the rotation of the wafer carrier 22 itself. The thickness of this boundary layer will depend upon various process conditions for each particular case, but is generally between about 0.5" and 2.0". The particular number can be evaluated using computational flow modeling as discussed in Brieland et al., "Design and Verification of Nearly Ideal Flow and Heat Transfer in a Rotating Disk Chemical Vapor Deposition Reactor," *J. Electrochem. Soc.*, vol. 138, no. 5, June 1991, pp. 1806–1816. Thus, approximately at the level H the diameter of the flow restricter 21 widens out to the diameter of the reactor wall 1a itself. The annular flow restricter 21 can, as shown in FIG. 1, be a separate element adjacent to the inner wall 1a of the reactor, or it can be part of the wall itself. Preferably, the interior of the annular flow restricter 21 is hollow, and can be used for the circulation of a coolant, or a cooling liquid such as water, therewithin. A specific control system based on temperature, and PID controllers, along with a flow rate regulating valve, can thus be used to stabilize the temperature of the cooling water in the injector plate 12, as well as in the flow restricter 21, to further improve the repeatability and uniformity of the deposition results obtainable with this reactor.

By including a flow restricter 21, it is possible to avoid depletion effects with respect to the reactant gases. Thus, depletion of the gas due to the wafer carrier 22 will usually take place in systems where the diameter of the injector plate utilized is less than the diameter of the wafer carrier 22. Furthermore, the flow restricter 21 eliminates the diffusion of reactants which can result in lower deposition efficiency as is the case in reactors where the diameter of the reactor is constant through the entire length of the reactor between the injector plate and the wafer carrier. By independently and precisely controlling the temperatures of the injector plate 12 and the flow restricter 21, reduced recirculation within the reactor can also be obtained.

The drive assembly used to rotate the wafer carrier 22 is also shown in FIG. 1. Within the reactor 1 is located a rotating shell 23 on the top of which is the wafer carrier 22. Indeed, the top element of rotating shell 22 can be a removable top and can be the same or different material from rotating shell 23. The rotating shell can also be made without any top element, and the wafer carrier 22 can merely be placed on top of the rotating shell 23.

In accordance with this invention, a pressure is maintained within the rotating shell 23 which is lower than the process pressure within the reactor 1 outside of rotating shell 23. Since the heating elements used in accordance with the present invention are located within the rotating shell (as discussed below), this factor alone enables one to reduce the heating power and filament temperatures therein. In any event, the rotating shell 23 itself can be made of different materials depending upon the particular application of the reactor. These can include graphite, graphite with SiC, pyrolytic boron nitride, graphite glassy coatings, hot press boron nitride, SiC, molybdenum, and high temperature super alloys. Preferably, a graphite shell with a SiC coating is employed. On the other hand, graphite with a glossy coating can be used for depositions of Group III–V materials, which are generally carried out at a relatively low temperature range of from about 600 to 800° C. Furthermore, such a graphite shell with a glossy coating will generally be less expensive and have better tolerances and surface characteristics than will an SiC coated graphite. These rotating shells can also be made of molybdenum or tungsten, which will provide for longer life, with a lower likelihood of cracking, and better overall sealing characteristics. However, the latter will have concomitantly higher costs associated therewith. Finally, when operating in an oxide environment, the use of boron nitride or superalloy shells will be preferred. It is most desirable to employ materials which have a low thermal conductance and which thus can be designed with a thin wall, so that the rotating shell 23 can be operated with reduced heat generated from thermal conductance thereby.

The rotating shell 23 is connected, at its lower end with a spindle 24. The spindle 24 is thus connected to the shell 23 by a number of screws or other such fasteners. Although there can thus be some leakage between the spindle and the shell, particularly where the pressure inside the shell is greater than the pressure within the reactor, such leakage is entirely acceptable. In these cases where such leakage is not desired, however, a high temperature O-ring, e.g., made of CHEMRAZ (up to 250° C.) can be utilized. The spindle 24 is, in turn, installed on bearings 25 using a clamp ring 26. For stable spindle rotation, a pair of radial, preloaded bearings can be utilized. Adjacent to the lower portion of the rotating shell 23 in the area where the lower annular wall 33 extends outwardly from the reactor 1, a rotary feed-through 29 extends through the bottom of the lower annular wall 33. The feed-through 29 is attached to a pulley 28 rotating therewith. Pulley 28 is thus located within the extension of annular bottom wall 33 and circular cover member 58. Its outer surface is enclosed by annular wall 34. The spindle 24 includes grooves on its outer surface into which drive belts 27 are applied to connect the spindle 24 to the pulley 28. Drive belts 27 thus extend around pulley 28 and spindle 24.

Feed-through 29 includes a solid shaft preferably of the ferro-fluidic type. Thus, rotary motion is provided by a motor (not shown) connected by a belt or chain (also not shown) to the vacuum rotary motion feedthrough 29 (e.g., of the ferro-fluidic type). The pulley 28 is connected with the rotary motion feedthrough 29, and the rotation is transferred using belts 27 on the pulley which is integrated into the spindle 24. The use of drive belts 27 is advantageous since they do not transfer significant load and can be made of vacuum-compatible O-rings, such as neoprene, for example. This, in turn, will simplify the design by eliminating the requirements for true alignment between the spindle 24 and the pulley 28. Indeed, no tension mechanism is specifically required in that case. On the other hand, the rotary feed-through 29 can be used to obtain rotation of the rotating shell 23 through a spindle 24 by other types of vacuum-compatible devices, such as metal belts, gears, chains, or the like. As for bearings 25, these will preferably utilize special vacuum-compatible grease and the like. A spring-energized seal 30 is preferably installed between the rotating shell 23 and the bearing housing 32. Thus, the spring-energized seal 30 creates a protective environment for the heating assembly which is located inside the rotating shell 23 by purging carrier gases into the rotating shell, which, again, is maintained at a lower pressure. Spring-energized seal 30 is thus not intended to be leakproof, but should just provide enough sealing to build a pressure inside the rotating shell which is lower than the higher process pressure.

Affixed to the rotating spindle 23 at a level above spindle 24 is an annular disk 45. This disk extends outwardly to essentially encompass the space between the outer surface of the rotating shell 23 and the inner surface of the reactor 1.

Preferably, the annular disk 45 includes an outer upturned lip 45a closely adjacent to the outer wall 34 of the reactor. Furthermore, it is preferably located at or below the exhaust conduit 2 for the reactor per se. In this manner, the disk 45 prevents small particles of material generated during deposition on the wafers from entering into and/or damaging the drive assembly therebelow.

As discussed above, the drive assembly is connected to the reactor 1 by means of outer wall 34 and upper wall 58. An annular coolant chamber 35 is located between the outer wall of the spindle 24 on the rotating shell 23 and the inner wall 1a of the reactor 1. A coolant, such as water, can be contained within the annular chamber 35, and preferably an inner surface which is quite close to the rotating spindle 24, generally between about 0.02" and 0.06". This coolant member is thus employed to reduce the spindle temperature by cooling through gas conductance to a temperature level which will not harm bearings 25. An inner annular coolant chamber 44 is contained within the inside of rotating shell 23 adjacent to its inner wall. Thus, the use of both inner annular cooling chamber 44 and outer annular cooling chamber 35 reduces the heat flow through the rotating shell 23 and the gases present therein in order to reduce the temperature of the bearing. Thus, the inner annular cooling chamber 44 is also hollow for containing coolant such as water therein. Thus, both the inner and outer cooling chambers 44 and 35, respectively, have actively water-cooled cylindrical surfaces coaxial with the rotating shell 23 and located as close to the rotating shell 23, on both sides thereof, as possible. Due to the thermal conductance of gas the presence of these inner and outer annular cooling chambers can reduce the temperature of both the rotating shell 23 and the spindle 24 to a level which is acceptable for the bearings, usually approximately 100° C. Indeed, use of any one of these inner and outer annular cooling chambers without the other would be quite inferior, and would result in overheating of the bearings by heat transfer through the gases therein.

Returning to the drive assembly, the entire drive mechanism is affixed to the annular base plate 33 and can thus be removed for maintenance or installed back in the reactor 1 as a single unit. Thus, the base plate 33 includes an inner offset opening covered by lid 36 which permits the entire heating assembly (discussed below) to be installed and removed from the bottom of the reactor without opening the reactor itself to the atmosphere. This provides distinct advantages in view of the fact that a bake-out procedure need not be performed. That is, it would normally be necessary to heat the reactor up to about 250° C. for at least several hours in order to remove water vapor which may have accumulated within the reactor when it was opened to the atmosphere. This creates a significant savings in terms of time and effort.

The heating assembly itself is supported by the removable lid 36 forming the base of the reactor 1. Again, the heating assembly itself can be installed within the rotating shell 23 through the opening formed in the annular base plate 33 when lid 36 is removed. Furthermore, this permits one to gain access to the heating assembly by removal of the lid 36, as well as replacement of the entire heating assembly, either with the same type of heating assembly, or with a different type. Preferably, where the inside of the rotary shell 23 is maintained at a higher pressure than the interior of the reactor 1, it is possible to gain access to the heating assembly and possibly repair or replace it, without disturbing the vacuum within the reactor itself. Heating for the wafer carrier 22 can be provided by a number of means including radiant heat, infrared, RF heating, or the like. In the specific radiant heating assembly shown in FIG. 1, the wafer carrier 22, and thus the wafers 70, are heated through he rotating shell 23 by single or multiple zone radiant filaments 37, which are stationary in this case. The power required for heating these filaments is supplied through electrodes 38, 39 and 40, which extend through the lid 36 and are connected to a standard vacuum electrical feed-through 41. The temperature of the wafer carrier 22 can be measured by thermocouples 42 and controlled using a standard PID temperature controller and a power supply connected with an electrical feed-through (not shown). A number of radiant heat shields 43 are included below the filaments 37 in order to reduce heat flow therefrom to the base plate itself.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A reactor for growing epitaxial layers on a substrate comprising a reactor chamber, a substrate carrier rotatably mounted within said reactor chamber, whereby at least one of said substrates can be mounted on said substrate carrier, a first gas inlet, a second gas inlet, an injector for injecting said first and second gases into said reactor chamber in a first direction towards said substrate carrier, and a gas separator disposed between said first and second gas inlets and said injector for separately maintaining said first and second gases in a single plane parallel to said substrate carrier for separately distributing said first and second gases within said single plane transverse to said first direction and over the surface of said injector, said first and second gas inlets supplying said first and second gases directly to said gas separator substantially in said first direction whereby said first and second gases are separately maintained until said first and second gases approach said substrate carrier.

2. The reactor of claim 1 wherein said gas separator includes first and second gas chambers in said plane parallel to said substrate carrier.

3. The reactor of claim 2 including a carrier gas inlet, and wherein said gas separator includes a third gas chamber between said first and second gas chambers for separately maintaining said carrier gas between said gas inlets and said injector, said injector thereby injecting said carrier gas into said chamber towards said substrate carrier between said first and second gases in order to maintain said first and second gases separate from each other.

4. The reactor of claim 1 wherein said gas separator includes first and second gas receiving portions for receiving said first and second gases from said first and second gas inlets, first and second gas chambers for distributing a quantity of said first and second gases prior to entry of said first and second gases into said injector, and wall means separating said first and second gas receiving portions from said first and second gas chambers, said wall means including an aperture for permitting said first and second gases to pass from said first and second gas receiving portions to said first and second gas chambers.

5. The reactor of claim 4 wherein said first and second gas chambers have a configuration defined by an arc of a circle.

6. The reactor of claim 1 including a mesh screen disposed between said gas separator and said injector for further distributing said first and second gases.

7. The reactor of claim 1 wherein said injector includes a plurality of gas passages for said first and second gases.

8. The reactor of claim 7 wherein said injector includes a cooling passage for cooling said first and second gases passing through said plurality of gas passages.

9. A reactor for growing epitaxial layers on a substrate comprising a reactor chamber, a substrate carrier rotatably mounted within said reactor chamber, whereby at least one of said substrates can be mounted on said substrate carrier, a gas inlet, an injector for injecting said gas into said reactor chamber towards said substrate carrier in a first direction, and a removable gas separator removably disposed between said gas inlet and said injector for maintaining said gas in a predetermined portion of said gas separator, whereby said gas separator can be replaced with a different gas separator, said gas separator including a gas receiving portion for receiving said gas from said gas inlet substantially in said first direction, a gas chamber for distributing a quantity of said gas in a direction substantially transverse to said first direction prior to entry of said gas into said injector, and wall means separating said gas receiving portion from said gas chamber, said wall means including an aperture for permitting said gas to pass from said gas receiving portion to said gas chamber.

10. The reactor of claim 9 wherein said gas separator includes a gas receiving portion for receiving said gas from said gas inlet, a gas chamber for distributing a quantity of said gas prior to entry of said gas into said injector, and wall means separating said gas receiving portion from said gas chamber, said wall means including an aperture for permitting said gas to pass from said gas receiving portion to said gas chamber.

11. The reactor of claim 9 including a mesh screen disposed between said gas separator and said injector for further distributing said gas.

12. The reactor of claim 9 wherein said gas inlet comprises a first gas inlet, and including a second gas inlet, whereby said injector injects said first and second gases into said reactor towards said substrate carrier, and said removable gas separator maintains said first and second gases separate from each other.

13. The reactor of claim 12 wherein said gas separator includes first and second gas chambers.

14. The reactor of claim 13 including a carrier gas inlet, and wherein said gas separator includes a third gas chamber between said first and second gas chambers for separately maintaining said carrier gas between said gas inlets and said injector, said injector thereby injecting said carrier gas into said chamber towards said substrate carrier between said first and second gases in order to maintain said first and second gases separate from each other.

15. The reactor of claim 12 wherein said gas separator includes first and second gas receiving portions for receiving said first and second gases from said first and second inlets, first and second gas chambers for distributing a quantity of said first and second gases prior to entry of said first and second gases into said injector, and wall means separating said first and second gas receiving portions from said first and second gas chambers, said wall means including an aperture for permitting said first and second gases to pass from said first and second gas receiving portions to said first and second gas chambers.

16. The reactor of claim 15 wherein said first and second gas chambers have a configuration defined by an arc of a circle.

17. The reactor of claim 12 including a mesh screen disposed between said gas separator and said injector for further distributing said first and second gases.

18. The reactor of claim 12 wherein said injector includes a plurality of gas passages for said first and second gases.

19. The reactor of claim 18 wherein said injector includes a cooling passage for cooling said first gas and second gases passing through said plurality of gas passages.

20. A reactor for growing epitaxial layers on a substrate comprising a reactor chamber, a substrate carrier rotatably mounted within said reactor chamber, whereby at least one of said substrates can be mounted on said substrate carrier, a first gas inlet, a second gas inlet, a carrier gas inlet, an injector for injecting said first and second gases and said carrier gas into said reactor chamber towards said substrate carrier in a first direction, and a gas separator for separately maintaining said first and second gases and said carrier gas between said gas inlet and said injector and for separately distributing said first and second gases and said carrier gas within a single plane transverse to said first direction and over the surface of said injector whereby said first and second gases and said carrier gas are separately maintained after said first and second gases and said carrier gas have exited from said injector towards said substrate carrier with said carrier gas disposed between said first and second gases.

21. The reactor of claim 20 including a mesh screen disposed between said gas separator and said injector for further distributing said first and second gases.

22. The reactor of claim 20 wherein said gas separator includes a first gas chamber for said first gas, a second gas chamber for said second gas, and a carrier gas chamber for said carrier gas.

23. The reactor of claim 20 wherein said gas separator includes first and second gas receiving portions for receiving said first and second gases from said first and second gas inlets, first and second gas chambers for distributing a quantity of said first and second gases prior to entry into said injector, and wall means separating said first and second gas receiving portions from said first and second gas chambers, said wall means including an aperture for permitting said first and second gases to pass from said first and second gas receiving portions to said first and second gas chambers.

24. The reactor of claim 23 wherein said first and second gas chambers have a configuration defining an arc of a circle.

25. The reactor of claim 20 wherein said injector includes a plurality of gas passages for said first and second gases.

26. The reactor of claim 25 wherein said injector includes a cooling passage for cooling said first and second gases passing through said plurality of gas passages.

27. A reactor for growing epitaxial layers on a substrate comprising a reactor chamber, a substrate carrier rotatably mounted within said reactor chamber, whereby at least one of said substrates can be mounted on said substrate carrier, a gas inlet, an injector for injecting said gas into said reactor chamber toward said substrate carrier, said substrate carrier comprising a substantially enclosed rotatable shell defining an inner space, said rotatable shell including an upper end facing said injector, and including a removable substrate support mounted on said upper end of said rotatable shell for rotation therewith so as to provide an upper end wall for said rotatable shell and thereby creating said substantially enclosed inner space, and a heater for heating said substrate carrier, said heater being disposed within said rotatable shell, said reactor chamber including an access port for gaining access to said inner space defined by said rotatable shell whereby said heater can be accessed and removed through said access port.

28. A reactor for growing epitaxial layers on a substrate comprising a reactor chamber, a substrate carrier rotatably mounted within said reactor chamber, whereby at least one of said substrates can be mounted on said substrate carrier, a gas inlet, and an injector for injecting said gas into said reactor chamber towards said substrate carrier, said injector including a plurality of coolant passages extending across said injector and a plurality of longitudinally extending gas apertures comprising a plurality of elongated slots extending across said injector and alternating with said plurality of coolant passages, whereby said gas is cooled by at least two of said coolant passages as it passes through at least one of said plurality of longitudinally extending gas apertures into said reactor chamber.

29. The reactor of claim 28 wherein said plurality of coolant passages comprises a plurality of tubular conduits arranged in a parallel array.

30. The reactor of claim 29 wherein said plurality of longitudinally extending elongated slots are arranged in parallel array.

31. The reactor of claim 29 including connecting passages for connecting at least two of said plurality of tubular conduits whereby said coolant can flow continuously therethrough.

32. The reactor of claim 28 wherein said plurality of coolant passages comprises a plurality of coolant passage segments, and including a plurality of coolant inlets and a plurality of coolant outlets, whereby said coolant can be separately fed to and withdrawn from each of said plurality of coolant segments.

33. The reactor of claim 32 including four of said coolant segments.

34. The reactor of claim 30 wherein said injector includes an inner surface facing said substrate carrier, and said plurality of elongated slots includes a chamfered surface on said inner surface of said injector thereby increasing the cooling effect of said plurality of tubular conduits.

35. The reactor of claim 28 wherein said gas inlet comprises a first gas inlet and including a second gas inlet, and a gas separator for separately maintaining said first and second gases between said gas inlets and said injector, said gas separator including first and second gas chambers for distributing a quantity of said first and second gases prior to entry into said injector.

36. The reactor of claim 35 including a carrier gas inlet, wherein said gas separator includes a third gas chamber between said first and second gas chambers for separately maintaining said carrier gas between said gas inlets and said injector, said injector thereby injecting said carrier gas into said chamber toward said substrate carrier between said first and second gases in order to separate said first and second gases from each other.

37. The reactor of claim 35 wherein said gas separator includes first and second gas receiving portions for receiving said first and second gases from said first and second gas inlets, and wall means separating said first and second gas receiving portions from said first and second gas chambers, said wall means including an aperture for permitting said first and second gases to pass from said first and second gas receiving portions to said first and second gas chambers.

38. A reactor for growing epitaxial layers on a substrate comprising a reactor chamber, a substrate carrier rotatably mounted within said reactor chamber, said substrate carrier having a predetermined diameter, whereby at least one of said substrates can be mounted on said substrate carrier, a gas inlet, an injector for injecting said gas into said reactor chamber toward said substrate carrier, whereby said gas and rotation of said substrate carrier creates a boundary layer of said gas above said rotating substrate carrier having a predetermined height, and a flow restricter mounted within said reactor chamber between said injector and said substrate carrier for restricting the flow of said gas therebetween, said flow restricter having a first end corresponding to said injector and a second end adjacent to said substrate carrier and defining a substantially constant inner diameter from said first end of said flow restricter to a location spaced about 0.5 to 2.0" from said substrate carrier, said inner diameter substantially corresponding to said predetermined diameter of said substrate carrier.

39. The reactor of claim 38 wherein said flow restricter includes a cooling passage.

40. The reactor of claim 39 wherein said cooling passage comprises a passageway within said flow restricter for flowing a coolant therethrough.

41. The reactor of claim 38 wherein said location proximate to said substrate carrier corresponds to the thickness of a boundary layer generated for the flow of said gas in said reactor.

42. The reactor of claim 41 wherein said inner diameter of said flow restricter at said second end comprises a tapered surface having an increasing diameter in the direction approaching said substrate carrier.

43. The reactor of claim 38 wherein said flow restricter is integral with the walls of said reactor chamber.

44. The reactor of claim 38 wherein said flow restricter includes an inner diameter at said second end greater than said predetermined diameter of said substrate.

45. A reactor for growing epitaxial layers on a substrate comprising a reactor chamber, a substrate carrier rotatably mounted within said reactor chamber, whereby said substrate can be mounted on said substrate carrier, a gas inlet, an injector for injecting said gas into said reactor chamber toward said substrate carrier, a flow restricter mounted within said reactor chamber between said injector and said substrate carrier for restricting the flow of said reactant gas therebetween, said flow restricter having a first end corresponding to said injector and a second end adjacent to said substrate carrier and defining an inner diameter at said first end substantially corresponding to said predetermined diameter of said substrate carrier, said inner diameter of said flow restricter at said first end thereof including substantially the entire length of said flow restricter, said flow restricter further including a cooling chamber, and control means associated with said cooling chamber for reducing recirculation within said reactor.

46. The reactor of claim 45 wherein said cooling chamber comprises a passageway within said flow restricter for flowing a coolant therethrough.

47. The reactor of claim 45 wherein said flow restricter is incorporated into the walls of said reactor chamber.

48. A reactor for growing epitaxial layers on a substrate comprising a reactor chamber, a substrate carrier rotatably mounted within said reactor chamber, whereby at least one of said substrates can be mounted on said substrate carrier, a gas inlet, an injector for injecting said gas into said reactor chamber toward said substrate carrier, said substrate carrier comprising a substantially enclosed rotatable shell defining an inner space, first pressure means for maintaining a first pressure inside said reactor chamber, second pressure means for maintaining a second pressure inside of said rotatable shell, said first pressure being greater than said second pressure, and a heater for heating said substrate carrier, said heater being disposed within said rotatable shell, said reactor chamber including an access port for gaining access to said inner space defined by said rotatable shell whereby said heater can be accessed and removed through said access port.

49. The reactor of claim 48 wherein said access port a wall of said reactor chamber.

50. The reactor of claim 48 wherein said heater means comprises a radiant heater.

51. The reactor of claim 48 wherein said rotatable shell includes an upper end wall facing said injector, and including a removable substrate support mounted on said upper end wall for rotation therewith.

52. The reactor of claim 48 wherein said rotatable shell includes an upper end facing said injector, and including a removable substrate support mounted on said upper end of said rotatable shell for rotation therewith so as to provide an upper end wall for said rotatable shell and thereby creating said substantially enclosed inner space.

53. The reactor of claim 48 wherein said rotatable shell comprises a material selected from the group consisting of graphite, boron nitride, silicon carbon, molybdenum, and high-temperature superalloys.

54. A reactor for growing epitaxial layers on a substrate comprising a reactor chamber, a substrate carrier rotatably mounted within said reactor chamber, whereby at least one of said substrates can be mounted on said substrate carrier, a gas inlet, an injector for injecting said gas into said reactor chamber towards said substrate carrier, said substrate carrier comprising a rotatable shell defining an inner space and including an inner surface and an outer surface, rotation means for rotating said rotatable shell within said reactor chamber, and cooler for cooling said reactor chamber, said cooling means including an inner cooling member for cooling said inner surface of said rotatable shell and an outer cooling member for cooling said outer surface of said rotatable shell.

55. The reactor of claim 54 wherein said rotation means comprises a spindle mounted with respect to said rotatable shell, a drive pulley, and a drive belt connecting said drive pulley to said spindle for rotating said rotatable shell.

56. The reactor of claim 55 wherein said spindle includes bearings for rotatably supporting said rotatable shell, whereby said cooler cools said bearings.

57. The reactor of claim 55 wherein said drive pulley comprises a drive belt comprising rubber.

58. A reactor for growing epitaxial layers on a substrate comprising a reactor chamber, a substrate carrier rotatably mounted within said reactor chamber, whereby at least ones of said substrates can be mounted on said substrate carrier, a gas inlet, an injector for injecting said gas into said reactor chamber toward said substrate carrier, said substrate carrier comprising a substantially enclosed rotatable shell defining an inner space, said rotatable shell including an upper end wall facing said injector, and including a removable substrate support mounted on said upper end wall for rotation therewith, and a heater for heating said substrate carrier, said heater being disposed within said rotatable shell, said reactor chamber including an access port for gaining access to said inner space defined by said rotatable shell whereby said heater can be accessed and removed through said access port.

\* \* \* \* \*

UNITED STATES PATENT AND TRADEMARK OFFICE
CERTIFICATE OF CORRECTION

PATENT NO. : 6,197,121 B1
DATED : March 6, 2001
INVENTOR(S) : Gurary et al.

It is certified that error appears in the above-identified patent and that said Letters Patent is hereby corrected as shown below:

Column 21,
Line 34, after "port" insert -- comprises --.
Line 36, delete "means".

Column 22,
Line 31, "ones" should read -- one --.

Signed and Sealed this

Sixteenth Day of October, 2001

*Attest:*

*Attesting Officer*

NICHOLAS P. GODICI
*Acting Director of the United States Patent and Trademark Office*